United States Patent [19]

Tepman

[11] Patent Number: 5,772,858
[45] Date of Patent: Jun. 30, 1998

[54] METHOD AND APPARATUS FOR CLEANING A TARGET IN A SPUTTERING SOURCE

[75] Inventor: Avi Tepman, Cupertino, Calif.

[73] Assignee: Applied Materials, Inc., Santa Clara, Calif.

[21] Appl. No.: 506,156

[22] Filed: Jul. 24, 1995

[51] Int. Cl.[6] .................................................. C23C 14/34
[52] U.S. Cl. .............................. 204/192.12; 204/298.08; 204/298.11; 204/298.19; 204/298.25
[58] Field of Search ..................... 204/192.12, 192.13, 204/298.03, 298.08, 298.11, 298.19, 298.2, 298.25

[56] References Cited

U.S. PATENT DOCUMENTS

| | | | |
|---|---|---|---|
| 3,775,285 | 11/1973 | Lane ............................... | 204/298.08 X |
| 3,985,635 | 10/1976 | Adam et al. ........................ | 204/298.11 |
| 4,410,407 | 10/1983 | Macaulay ....................... | 204/298.11 X |
| 5,114,556 | 5/1992 | Lamont, Jr. ..................... | 204/298.08 X |
| 5,223,112 | 6/1993 | Tepman ............................. | 204/298.11 |
| 5,314,597 | 5/1994 | Harra .............................. | 204/298.19 X |
| 5,320,728 | 6/1994 | Tepman ............................ | 204/298.2 X |

OTHER PUBLICATIONS

Vossen et al., "Thin Film Process", pp. 41–42, Academic Press, 1978.

*Primary Examiner*—Nam Nguyen
*Attorney, Agent, or Firm*—Patterson & Streets, L.L.P.

[57] ABSTRACT

A magnetron sputtering process and apparatus for cleaning a target, thereby eliminating back sputtered particles from the target surface and effecting uniform erosion of the target is provided. A deposition chamber comprises a magnetron assembly, a shutter mechanism, D.C. and R.F. power sources, and means for alternatively switching the power sources for sputter deposition and target cleaning. As an example, application of D.C. power sputters target material in regions located between the poles of the magnets of the magnetron assembly. At selected intervals during which a processed substrate is removed from the chamber, R.F. power is then applied to the chamber to establish a plasma which sputters the target in lesser eroded regions and removes previously deposited back sputtered particles thereon.

20 Claims, 5 Drawing Sheets

METHOD AND APPARATUS FOR CLEANING A TARGET IN A SPUTTERING SOURCE

FIELD OF THE INVENTION

The present invention relates in general to the field of magnetron sputtering devices and their use in the deposition of materials onto substrates. More particularly, the present invention relates to a method and apparatus for manipulating an electrical bias to create alternating effects of the magnetic fields over a sputtering source target surface for the purpose of cleaning away previously back sputtered particles. More particularly still, the present invention is intended to render more uniform lifetime erosion of the target surface and to ensure quality, uniform deposition of sputtering material onto substrates.

BACKGROUND OF THE INVENTION

Sputtering is a well known method of depositing a film layer onto a semiconductor substrate. A typical sputtering apparatus includes a vacuum chamber that encloses a target and a substrate support pedestal. The target is typically affixed to the top of the chamber, but is electrically isolated from the chamber walls. A voltage source maintains the target at a negative voltage with respect to the electrically grounded walls of the chamber to excite into a plasma state an inert gas (typically argon) which is supplied to the chamber and maintained in the chamber at a low pressure. Ions from the plasma bombard the target and eject particles of target material from the target toward the substrate. These particles deposit on the substrate to form the desired film. While the goal of sputter deposition is to create an even deposition of a film layer onto the substrate, the sputtered particles deposit on other exposed chamber surfaces. In addition, a portion of the sputtered particles will be back sputtered onto, i.e., they will return to, the target.

Magnetron sputtering is one method of increasing the sputtering, and thus the deposition rate. It employs a magnetic source to create an arched magnetic field superimposed on the electric field created between the target and the grounded elements of the chamber. The magnetic source is generally provided behind the target and it commonly comprises inner and outer pole pieces and a yoke connecting the opposite pole's pieces. The magnetic flux generated from this source exits from and returns to the surface of the target, thereby forming an arched magnetic field adjacent the surface of the target. The arching magnetic field includes both parallel and perpendicular field line components relative to the target surface.

One typical magnetron sputtering assembly 10 is illustrated in FIG. 1a which shows a simplified magnet structure 12 and target 14, other parts being omitted for simplicity. This particular type of magnet structure has a coaxial arrangement of an N-type center pole 16 and an outer S-type annular pole 18 connected by a disc shaped yoke 20, which are mounted adjacent the non-sputtered side of the target. One such magnetron sputtering system is disclosed in U.S. Pat. No. 5,320,728 entitled "Planar Magnetron Sputtering Source Producing Improved Coating Thickness Uniformity, Step Coverage and Step Coverage Uniformity" issued Jun. 14, 1994 in the name of Avi Tepman, the disclosure of which is hereby incorporated herein by reference.

Application of a negative D.C. bias to the magnetron target 14 results in a sputtering pattern having maximum erosion of the target in the regions where lines of magnetic flux are parallel with the surface of the target, in this case in the region just between the poles of the magnetic source. In FIG. 1a, the crossed hatched area 22 demonstrates the parallel magnetic field region. Where the location of the parallel component of the magnetic field remains constant during the sputtering process, the maximum erosion of the target takes the form of a groove 13 (shown in FIG. 2) in the target corresponding to the region 22 where the magnetic field lines intersect the electric field at a right angle. Typically, such grooved erosion patterns are in the form of an oval track on the target, but depend on the location of the stationary magnets with respect to the target surface.

If the D.C. bias on the target is changed to R.F., the greatest sputtering will occur where the component of the magnetic field is perpendicular to the target and erode the target in areas 17 (shown in FIG. 2) in exact relief and complimentary to the target erosion pattern created by D.C. bias. Referring to FIG. 1b, application of R.F. bias to the target results in the greatest sputtering of the target occurring in the areas under the magnet poles. In FIG. 1b, the arching lines 29 represent the magnetic flux and the path along which the electrons travel. The maximum erosion of the target takes the form of a groove 17 (shown in FIG. 2) in the target corresponding to the region where the magnetic field lines are perpendicular to the target under the magnet poles. As is the case with D.C. sputtering, typically the grooved erosion patterns are in the form of an oval track on the target, dependent upon the location of the magnets with respect to the target surface.

The life of a target is limited by the progress of erosion in the annular areas as demonstrated in FIG. 2. When either D.C. or R.F. magnetron sputtering is continuously applied, the target has to be replaced frequently because of persistent target consumption in the corresponding annular grooves. As an annular groove progressively forms in the target during sputtering thereof, the "hill", i.e., slightly or non-eroded, regions tend to accumulate back sputtered material because of non-erosion of these regions. Where the back sputtered material does not form a tight bond with the target, it may flake off and contaminate a substrate. In the groove regions, any back sputtered material is quickly re-sputtered off the target. The life of the target is thus governed by the erosion rate of the grooves, the thickness of the target, and the increased likelihood that back sputtered material will flake off the target the longer the target is in service.

In certain applications, the problem of back sputtering, i.e. the accumulation of undesirable back sputtered species on the non-eroded hills of the target, is more acute. For example, reactive sputtering of a titanium target in a nitrogen-containing plasma is a method frequently employed to deposit titanium nitride layers onto substrates. The properties of the titanium nitride layer may be altered by changing the nitrogen concentration in the plasma. Where such a nitride layer is created by reaction of the sputtered material with nitrogen in the chamber, the resulting sputtered material will have a different composition. This back sputtered nitrogenous material requires almost immediate removal to prevent flaking thereof and contamination of a wafer during processing.

Therefore, there exists a need to intermittently clean a target in a sputtering chamber between deposition cycles to remove back sputtered material from the target surface to prevent particulate contamination of semiconductor substrates being processed on an ongoing basis. Prior art devices and methods for cleaning sputtering targets generally require structural changes to the processing apparatus, particularly the magnetic source, which are expensive and not practical as an efficient tool for the elimination of the problems associated with back sputtered material on the target source. In addition, these prior art processes for cleaning targets and deposition chambers generally require significant non-productive down time which is costly.

The present invention is based on the discovery of a means for the alternate attrition of previously lesser consumed target areas for the purpose of target cleaning and erosion uniformity. The invention is directed to an expeditious and inexpensive process and apparatus for cleaning a sputtering target by generating a plasma in a planar magnetron sputtering apparatus by application of alternate D.C. and A.C. (preferably in the radio frequency range) power sources to the target resulting in uniform erosion of the target as well as removal of back sputtered particulate contaminant deposits without interruption of the deposition process.

SUMMARY OF THE INVENTION

The present invention provides apparatuses and methods for depositing film layers onto a substrate and intermittently cleaning the target and portions of the deposition chamber to facilitate uniform erosion of the target. The deposition process is carried out in a deposition chamber employing a magnetron sputtering system. To effect target cleaning, a plasma is generated between an anode and the cathode target through application of a first power source. Film layer deposition is achieved using a first power source and target cleaning is accomplished by application of a second power source, thereby causing reciprocating or alternating attrition of the target (i.e., sputtering of the target in previously lesser eroded areas) resulting in uniform erosion of the target over its full life. Preferably, deposition of film layers onto a substrate occurs under D.C. power and target cleaning occurs under application of R.F. power. The present invention also contemplates deposition under R.F. power and cleaning under D.C. power.

The instant invention provides the advantage of continuous removal of contaminant back sputtered particulate material from the target in ongoing sputter processing of semiconductor substrates. The invention is particularly useful in the sputter deposition in nitrogen environments, i.e. environments in which a metal target such as Ti or Ta is sputtered and metal nitride layers such as TiN and TaN are formed on substrates. In addition, the invention may be used to provide full and uniform consumption of the target thereby enhancing the quality of the film layers deposited onto the substrates and extending the useful life of the target.

A preferred apparatus of the present invention includes a deposition chamber having disposed therein a target biased as a cathode, an anode, a magnetron assembly, a shutter mechanism, a substrate support member, and a power switching means to provide both D.C. and R.F. power to the anode and cathode, thereby establishing an electrical differential in which a plasma is generated. Following a deposition cycle during which target material is deposited onto a substrate and back sputtered material deposits onto the target, the shutter mechanism is actuated to isolate the target from the substrate support member of the deposition chamber. Then a switching means replaces the D.C. power with R.F. power to alter the concentration of electrons and ionized gas molecules of the plasma (i.e., plasma rich regions) in a complimentarily different pattern on the target relative to the magnetic poles, i.e., under the magnet poles. Consequently, alternate attrition of the target material occurs in the "hill" regions on the target where back sputtered material is likely to deposit during deposition under D.C. power. The shutter assembly is then removed from the deposition chamber, communicating the substrate support member to the chamber, a substrate is introduced into the chamber, and sputtering of the target is resumed under D.C. power. It is specifically contemplated that other protective devices, such as a phantom wafer, may be used in place of a shutter.

A target cleaning method of the present invention includes providing a deposition chamber wherein deposition of target material has previously occurred under a D.C. or R.F. power source, introducing a shutter mechanism or other component protective device into the chamber to isolate the target from other areas of the chamber following removal of the processed substrate from the deposition chamber, and replacing the first power source with the alternative power source to sputter lesser eroded areas of target material located in regions on the target where back sputtered material is likely to have deposited under D.C. power processing. These cleaning steps occur during the interim period of time in which the processed substrate is shuttled out of the deposition chamber and a new substrate is shuttled into the deposition chamber for processing.

Specifically, the present invention is directed to a magnetron sputtering apparatus comprising;

a) an evacuable chamber having a means of introducing gases, anodic sidewalls and base, and a pedestal support for holding a semiconductor substrate for processing;

b) a planar cathodic target within the chamber, a front face of the target being parallel to the pedestal support;

c) partitioning means disposed between the target and pedestal to isolate the pedestal from communication with the chamber;

d) magnetic source means for generating a magnetic field over the surface of the target;

e) an alternative D.C. or R.F. power source means to generate a plasma within the chamber; and f) switching means to alternate a D.C. or R.F. power supply to the cathode and anode terminals in the chamber.

The present invention is further directed to a method of intermittently cleaning a target source during material deposition in a deposition chamber comprising;

a) providing a vacuum chamber including a planar cathodic target, anodic sidewalls and base, and a pedestal substrate support in parallel alignment with the target;

b) applying a magnetic force perpendicular to the planar target;

c) applying a D.C. voltage between the cathodic target and anodic base to cause sputtering of the target material onto a substrate positioned on the pedestal support;

d) partitioning the pedestal support from the target source so as to isolate the cathodic target and anodic base and sidewalls from the pedestal support; and e) applying R.F. power between the cathodic target and anodic base and sidewalls to generate a plasma in areas reciprocal to those areas in which plasma was generated under D.C. power thereby causing reciprocal and compensatory cleaning and erosion of the target resulting in a uniform area of target erosion throughout the process run.

It is, therefore, an object of the present invention to provide a method and apparatus for cleaning a target in situ, thus increasing the useful life of a target, reducing downtime associated with frequent target replacement and other methods of cleaning targets, and reducing detrimental particle formation on the target above the surface of the substrate.

It is an advantage of the present invention that particulate contamination of substrates in a deposition chamber can be minimized.

It is another advantage of the present invention that pattern erosion of a target be modified through application of alternating power sources.

It is another advantage of the present invention to provide in situ target cleaning during an interim period of time necessary to remove a first substrate from the chamber and introduce a second substrate into the chamber without interrupting the deposition process. It is another advantage of the present invention to partition off a part of the chamber to confine target cleaning to areas within the chamber specifically configured to be removed and cleaned.

It is another advantage of the present invention that it can be retrofitted into existing chambers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

DESCRIPTION OF THE PREFERRED EMBODIMENT

Figure 4:
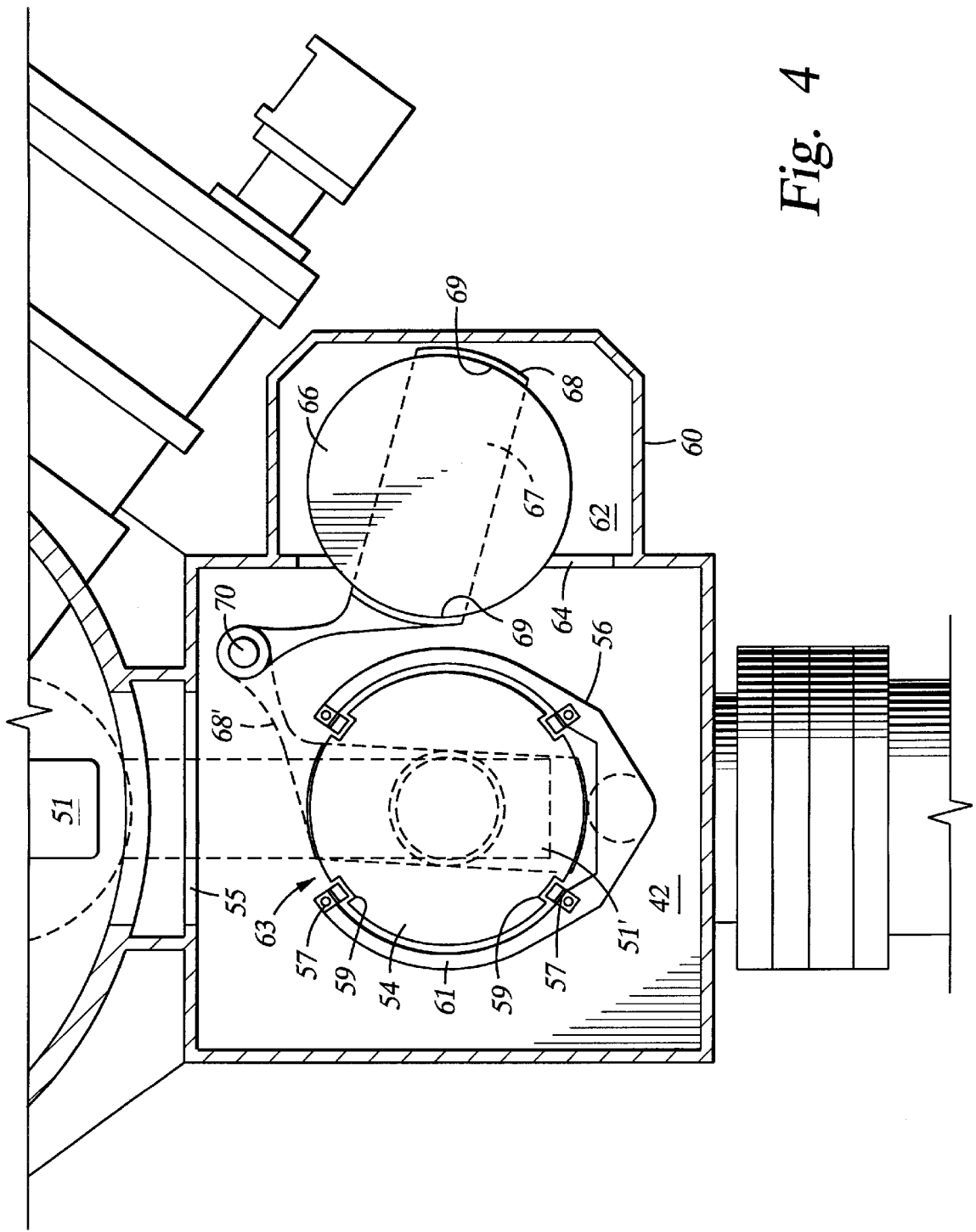
FIG. 4 is a top view of the processing chamber including the magnetron assembly, the shutter mechanism, and the switching means to provide D.C. or R.F. power to the anode and cathode.
Figure 5A:
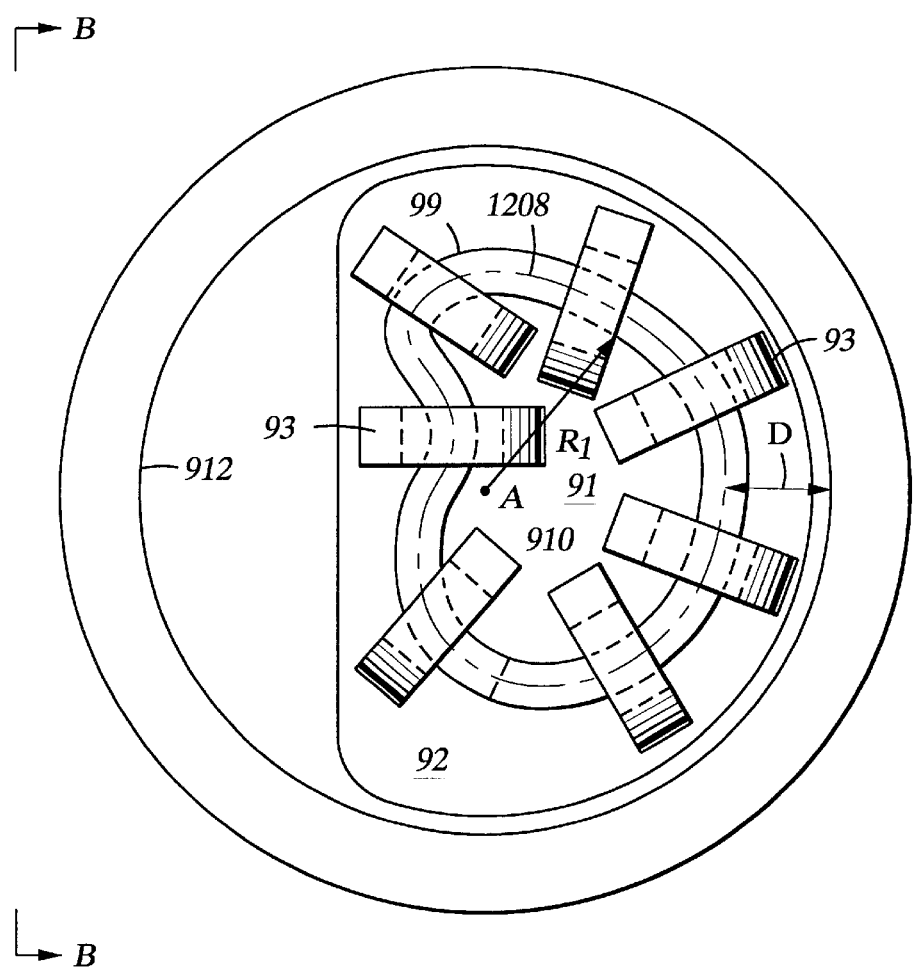
FIG. 5a is a top cross-section view, taken substantially along the line 3b—3b showing the magnetron assembly and the pattern of erosion created by the magnetic field produced by the magnets of the assembly.
Figure 5B:
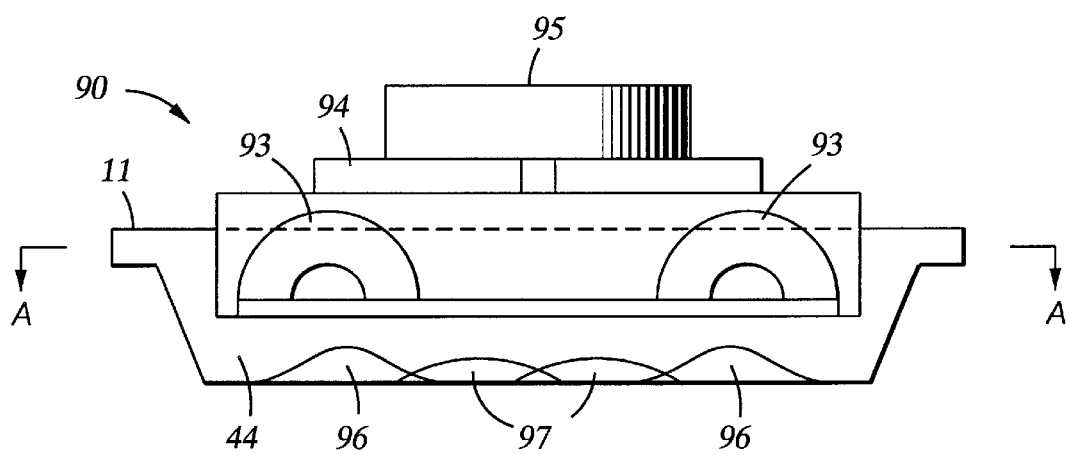
FIG. 5b is a side cross-sectional view, taken substantially along the line 3a—3a, of the magnetron assembly and the target erosion pattern produced between the poles of the magnets.
Figure 6:
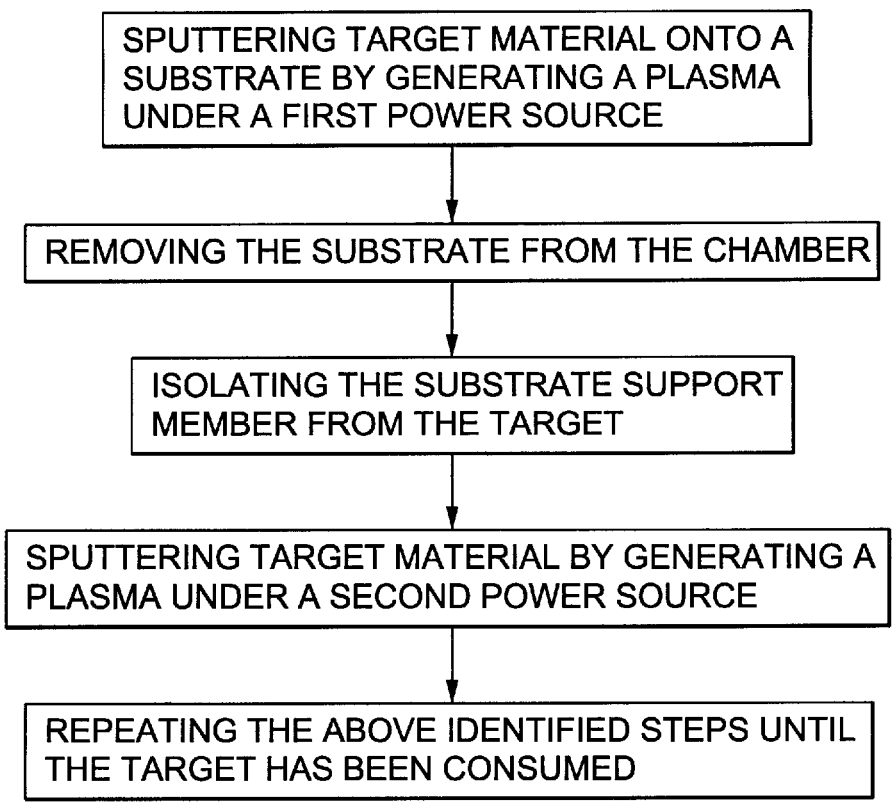
FIG. 6 is a flow diagram of the process of the present invention.

A preferred embodiment of the present invention, as shown in FIGS. 3 to 5b, includes a magnetron deposition process and apparatus whereby a first region of the target is sputtered onto a substrate by application of a first power supply and a complimentary region of the target is sputtered onto a shutter plate disposed in the chamber under a second power supply, thus causing uniform erosion of the target and removal of detrimental back sputtered particles from the target surface (as shown generally in FIG. 6). The process of cleaning complimentary regions of the target under the second power supply is accomplished expeditiously during an interim period of time between the removal of a processed substrate from the chamber and introduction of the next substrate to be processed into the chamber, which may be a window period, between substrate deposition cycles, of less than 60 seconds. Newer generation sputtering chambers have interim periods between wafer processing of less than 15 seconds. Because this process of sputtering the complimentary regions of the target occurs without interruption of the deposition cycle, cleaning can be accomplished more frequently, thereby forestalling the need for non-productive chamber shutdown for mandatory cleaning of the chamber and target replacement.

Preferably, sputter deposition occurs through application of a D.C. power supply, and target cleaning occurs through application of an A.C. power supply in the radio frequency range. However, it is contemplated by the inventor that sputter deposition may occur through application of an A.C. power supply in the radio frequency range, and target cleaning may occur through application of a D.C. power supply. It is to be understood by those skilled in the art of sputter deposition that the use of the term R.F. power supply is used interchangeably with A.C. power supply and means A.C. power supply in the radio frequency range.

This process is particularly well suited to chambers where nitride layers, such as TiN, are being formed on the substrate. The abundance of nitrogenous species which are back sputtered onto the target pose significant particle contamination threat to the integrity of devices being formed on the substrate. Therefore, the ability to remove these particles from the target surface during the time period required to remove the first substrate from the chamber and introduce a second substrate into the chamber for processing has significant advantage. Furthermore, uniform erosion of the target may be achieved thereby enhancing the quality of film layer deposition onto substrates.

An Apparatus

Figure 3:
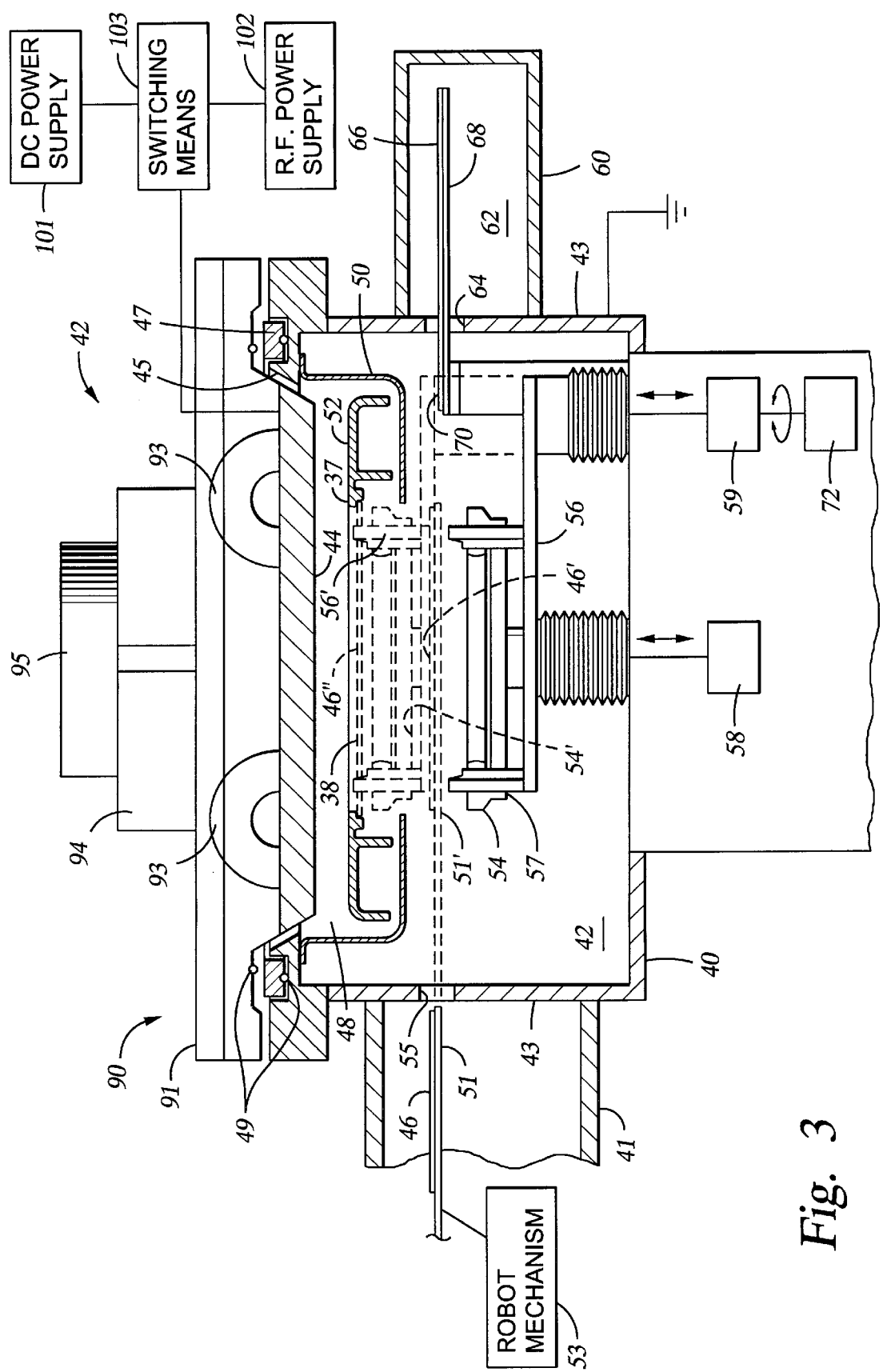
FIG. 3 is a side view showing a processing chamber including a magnetron assembly, a shutter mechanism, and a switching means to provide D.C. or R.F. power to the anode and cathode.

Referring to FIG. 3, a typical apparatus adapted to sputter a metal coating onto a semiconductor substrate includes a vacuum chamber 42 within which a high vacuum is produced. Chamber 42 is typically enclosed by sidewalls 43 and magnetron assembly 90 that also functions as the lid 11 (shown in FIG. 5b) for the vacuum chamber 42. The sidewalls 43 are often formed of a metal such as stainless steel or aluminum. Attached to the underside of the lid is a target 44 formed of a material, such as Al, Ti, Ta or W in pure or alloy form, that is to be sputtered onto a substrate 46'. In the bottom of chamber 42 is a support member 54 on which the substrate is positioned during processing. In one embodiment of the invention, shutter mechanism 66 is disposed between the underside of the target 44 and the upper surface of the support member 54' whenever target cleaning is performed. A power supply (D.C. power source 101 or R.F. power supply 102) produces a D.C. or R.F. potential difference, respectively between walls 43 (anode) and the target to generate a plasma and accelerate ions into the target 44 to sputter particles onto the substrate. The target is electrically isolated from housing 40 by means of insulative ring 47 and is pneumatically sealed thereto by means of resilient O-rings 49. Because of the heat generated by the impact of high energy ions on the target 44, a coolant system, such as water-cooled chamber 94 (also serving as a mount for motor 95), is thermally connected to the target. To enhance cooling of the target, the lid 11 is formed of a highly heat-conductive material such as copper.

In magnetron sputtering systems, a magnetic field is produced within chamber 42 between the poles of the magnets adjacent target 44 to increase the generation of ions near the target. These magnets create electron traps which typically consist of one or more closed loop regions within which the magnetic field is substantially parallel to the target. In these regions, the electric field and magnetic field are substantially perpendicular and produce an E×B drift field that pushes electrons parallel to the surface of the target. Because these regions form closed loops under D.C. power, the electrons become trapped near the target, thereby functioning effectively to produce ions that impact the target. In the sputtering system, magnetron assembly 90 (shown in FIG. 5b) produces these electron trap regions. Importantly, the closed loop regions may be located over different, but complimentary regions of the target 44 by applying different power source 102, i.e., D.C. power source 101 and R.F. power sources, to the chamber 42.

As is illustrated in FIGS. 5a and 5b, magnetron assembly 90 may include pole pieces 91 and 92, magnets 93, lid 11, target 41, and a water-cooled motor mount 94 that couples pole pieces 91 and 92 and associated magnets 93 to a motor 95. All of the magnets 93 have the same polarity magnetic pole overlying pole piece 91. Although electromagnets can be used to produce a magnetic field between the pole pieces, permanent magnets are preferred because of their greater field strength.

Figure 1A:
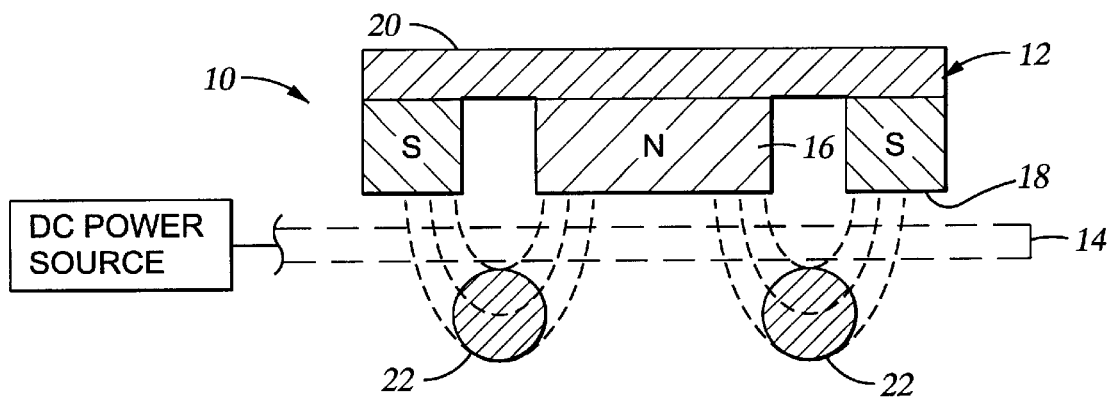
FIG. 1a is a cross sectional view of a conventional coaxial magnet arrangement demonstrating plasma generation under a D.C. voltage generated electric field.
Figure 1B:
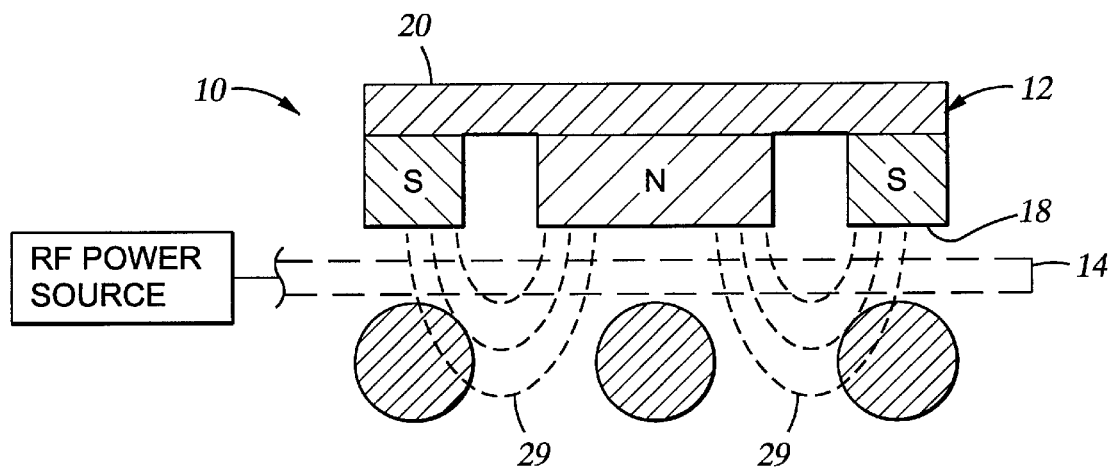
FIG. 1b is a cross sectional view of a conventional coaxial magnet arrangement demonstrating plasma generation under a R.F. voltage generated electric field.
Figure 2:
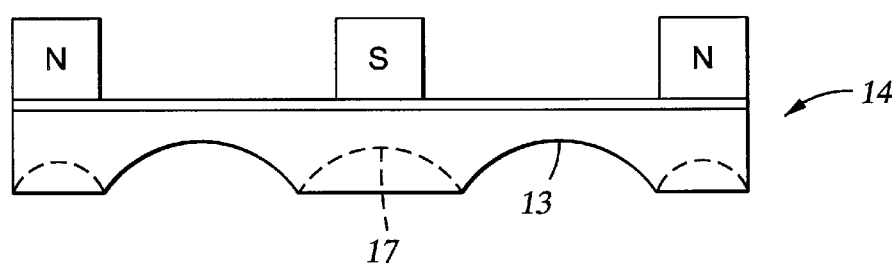
FIG. 2 shows a cross section of an eroded target under both a D.C. and a R.F. voltage generated electric field.

The magnetic fields established by the magnets facilitate sputtering of the target in different regions and patterns on the target depending on the type of power source. D.C. power produces erosion of the target between the poles of the magnet as shown in FIGS. 2 and 5b. This result is obtained because a D.C. generated plasma is attracted to the parallel component of the magnetic field which is located adjacent the substrate between the poles of the magnet. Consequently, very little or no erosion of the target occurs near the poles of the magnets with application of D.C. power because the plasma is focused between the poles and undesirable back sputtered material will likely build up on the surface of the target near the poles of the magnets. During processing, this back sputtered material may flake off and detrimentally deposit on the surface of the substrate being processed, thereby contaminating the devices formed thereon.

Where R.F. power is supplied, the electrons follow the lines of magnetic flux to the poles where the magnetic field is perpendicular to the target, thereby increasing gas ionization and increased sputtering near or under the poles of the magnets, the opposite, but complimentary, effect of D.C. power. This phenomena is caused by the fact that the electrons of the plasma generated by R.F. power form an ion dense region along the perpendicular component of the magnetic field. The process of alternating the power source between D.C. and R.F. power erodes the target at different, but complimentary, regions thereon. The erosion pattern of the target is dependent upon the power source and the relative positioning of the magnets creating the magnetic field. Accordingly, back sputtered material may be sputtered off the target by alternating the power source between D.C. and R.F. power, thereby creating magnetic fields which concentrate ions along the perpendicular component of the magnetic field and form ion traps in the areas on the target where back sputtered material has deposited.

Because the back sputtered material is unwanted and must be prevented from entering and depositing in other areas of the deposition chamber, in the preferred embodiment a shutter mechanism is included to isolate the target from other areas of the chamber during in situ target cleaning. Referring to FIG. 3 of the drawings, a preferred embodiment of the present invention is shown. In such embodiment, a housing 40 is depicted forming an evacuable processing chamber 42, the upper portion of which forms a sputtering region wherein metal is sputtered from an anode plate 44 onto the upper surface of a substrate 46".

Chamber 42 is accessible from the top and closed by the anode assembly 43 which includes the anode plate 44 which extends into the circular opening 45 formed in the top housing 40. Note that the closure 43 is electrically isolated from the housing 40 by means of an insulative ring 47 and is pneumatically sealed thereto by means of resilient 0-rings 49. The sputtering region 48 is defined by the anode plate 44, a cathode forming bowl 50 having a central opening 36 formed in the bottom thereof, and a substrate clamp 52, the inner periphery of which defines a plating aperture or opening 38. The anode and cathode are electrically interconnected to both a D.C. power supply source 101 and R.F. power supply source 102 with a switching means 103 included therebetween to alternate the power source between D.C. power and R.F. power.

Disposed within chamber 42 is a substrate support member 54 and lift assembly 56 including four upstanding substrate engaging fingers 57. Support member 54 is moved by an actuator 58 between a lower position, as shown by the solid lines, and an upper position, indicated by the dashed lines 54' located immediately below the in-place substrate 46'. The support member 54 may be a pedestal or a heater.

As will be further explained below, lifting assembly 56 is moved by an actuator 59 between a lower position, as shown by the solid lines, and an upper position indicated by the dashed lines 56'.

Extending from one side of the housing 40 is a communicating passageway for the shuttle blade 51 of a robotic substrate transport mechanism 53 which moves substrates into and out of chamber 42 through a slit 55 as suggested by the dashed lines 51".

Extending from the right side of housing 40, as depicted, is an extended housing 60 forming a subchamber 62 which communicates with chamber 42 by means of a slit 64 and forms a retraction compartment for a shutter plate 66 and its associated transport arm 68. Arm 68 is connected to the rotatable shaft 70 of a rotary actuator 72 and, as is more clearly shown in FIG. 4, swings from the retracted position 68 indicated to an extended position 68' lying above support member 54.

Turning now to FIG. 4, which is a top cross-sectional view taken generally along line 2—2 of FIG. 3, shutter plate 66 rests upon a transport arm base portion 67 and is held in place by upstanding ribs or lips 69, and can be swung from its retracted position 68 within chamber 62 to its extended position 68' overlying support member 54. Shutter plate 66 is normally a disk configured substantially similar to a substrate to be processed and is made of a metal, ceramic or other suitable material.

Operation of the Chamber Including the in situ Cleaning Process

In operation, referring simultaneously to FIGS. 3 and 4, it will be understood that a substrate 46 resting atop the transport blade 51 of robot mechanism 53 can be moved through slit 55 and into the position 46' where it can be lifted from the blade 51 into the processing position 46" (in opening 38) by the lifting fingers 57. Note in FIG. 3, that the lift assembly 56 includes a yoke-like structure including arms 61 that are open at 63 to provide clearance for blade 51 when it is in the position 51'. As soon as blade 51 is withdrawn, support member 54 can be raised into its substrate processing position immediately below the bottom surface of substrate 46". The substrate, lift assembly and support member will remain in the raised position for a predetermined period of time to accomplish the processing operation. D.C. power, in the range of −400 to −600 V, is supplied to the cathode. The cathode and the anode, having an applied voltage of +24 V, generate a plasma which effectuates sputtering of the target material in a race track pattern restricted to the target regions between the poles of the magnets. The chamber is evacuated to a low pressure to enhance the quality of the deposition layer, a process which is well known in the art.

On completion of the processing operation under D.C. power, support member 54 will be lowered, robot shuttle blade 51 will be reinserted into the position 51', and lift assembly 56 will be caused to lower substrate 46" onto blade 51' as indicated at 46' (FIG. 3). Assembly 56 will then continue to be lowered until substrate 46' is clear of fingers 57 and can be withdrawn by blade 51.

As soon as blade 51 has caused substrate 46' to clear the top of support member 54, actuator 72 can be energized to swing arm 68 and shutter plate 66 into position over support member 54 and in alignment with fingers 57. Actuator 59 will then be energized to lift assembly 56 into engagement with shutter plate 66, and will continue to move upwardly raising plate 66 off of arm 68 and into the processing position previously occupied by substrate 46". This effectively closes the processing aperture or opening 38 and allows the target cleaning process to begin. With the shutter in place, R.F. power is applied to the chamber. The application of R.F. power to the chamber alters the concentration of electrons as described above, thereby sputtering target material over the poles of the magnets. R.F. sputtering is preferably conducted with R.F. excitations at 13.56 MHZ, a so-called "ISM" frequency, and at other, higher, ISM frequencies.

When the target is being cleaned in situ, preferably an R.F. power supply 102 is applied between an anode and a cathode. The R.F. power supply can be rectified to produce a D.C. power which can be applied between the anode and cathode. Switching means 103 allows the power supplies to be alternated.

The application of an alternate power source (i.e., R.F. power) creates magnetic fields which concentrate ions near or under the poles of the magnets in areas of lesser erosion of target material where back sputtered particles have deposited onto the target during sputtering via D.C. power, as more fully described above. The target material in these areas, including any back sputtered material which has deposited onto the target in these areas, is sputtered for a period of ten to thirty seconds, the time period required to remove one substrate from the chamber and introduce a new substrate into the chamber for processing. The shutter is positioned to isolate the target from and to protect other areas of the chamber from this subsequent target cleaning deposition process. The pressure in the chamber may be held constant at the same pressure used in D.C. sputtering, or the pressure may be increased. Because the R.F. powered cycle effects cleaning, and not deposition of metal layers onto a substrate, the concern over pressure dependent deposition layer quality is eliminated.

When a new substrate is positioned for introduction into the chamber, the operative cycle will be reversed, the shutter plate retracted into chamber 62, the new substrate moved into position for processing, and D.C. power will be restored to the chamber to begin sputtering target material onto the substrate.

Although a swing arm configuration has been disclosed above as the preferred means of moving a shutter plate into and out of the lift system, it will be appreciated that in the alternative a reciprocatable blade type, or any other suitable type of shutter transport means could be utilized to present the shutter plate to the lift assembly or to itself lift the shutter plate into the plating aperture. In addition, any apparatus useful in the isolation of the substrate support member could be utilized in the present invention. Furthermore, it will be appreciated that the novel combination of functional elements disclosed above is not limited to sputtering applications and in fact will have application in similar apparatus used to implement many other substrate deposition and/or etching processes.

Importantly, existing chambers can be retrofitted with the power supply sources and switching means 103 to accomplish the advantages of the present invention in these devices.

While the foregoing is directed to the preferred embodiment of the present invention, other and further embodiments of the invention may be devised without departing from the basic scope thereof, and the scope thereof is determined by the claims which follow.

What is claimed is:

1. A method of intermittently cleaning a target source during material deposition in a sputter deposition chamber comprising;
    a) providing a vacuum chamber including a planar cathodic target, anodic sidewalls and base, and a substrate support member in parallel alignment with the target;
    b) applying a magnetic force perpendicular to the planar target;
    c) applying one of a D.C. or an R.F. power supply between the target and base and sidewalls to cause sputtering of the target material, in an erosion area, onto a substrate positioned on the pedestal; and
    d) applying the alternative power supply selected in step C, between the target and base and sidewalls to sputter the target in areas reciprocal to those areas in which erosion was generated under the first power supply thereby causing removal of back sputtered material from the target and uniform erosion of the target throughout the process run.

2. The method of claim 1, further including the step of partitioning the substrate support member from the target source so as to isolate the target and base and sidewalls from the substrate support member.

3. The method of claim 2 wherein a shutter plate isolates the pedestal from the target.

4. The method of claim 2 wherein the steps of partitioning the pedestal and applying the alternative power supply occur during an interim period required to remove one substrate and introduce a subsequent substrate.

5. The method of claim 4 wherein the application of the alternative power supply occurs for a period of less than 60 seconds.

6. The method of claim 1, wherein said power supply selected in step c provides a D.C. voltage and said alternative power supply of step d provides power in the radio frequency range.

7. The method of claim 1, wherein said power supply selected in step c provides power in the radio frequency range, and said power supply of step d provides power a D.C. voltage.

8. A method of cleaning a target surface in a sputtering source, comprising:
    providing a deposition chamber including a support member therein;

providing a target biased by a magnetic field in said chamber;

sputtering target material onto a substrate positioned within said chamber by applying D.C. power across an anode and said target biased as a cathode;

removing said substrate from said chamber;

partitioning said support member from the target surface to isolate the cathodic target from said support member;

applying R.F. power across said anode and said target biased as said cathode;

de-partitioning the support member from the target; and positioning another substrate onto the support member.

9. The method of claim 8 wherein a shutter plate partitions off said support member from said target.

10. The method of claim 8 wherein the steps of partitioning off said support member and applying R.F. power occur during a time period required to transport one substrate out of said chamber and transport a new substrate into said chamber.

11. The method of claim 10 wherein the time period required to transport one substrate out of said chamber and transport a new substrate into said chamber is less than 60 seconds.

12. A sputtering process, comprising:

applying a D.C. power between an anode and a target forming a cathode in a chamber;

generating a glow discharge of free ions;

providing a magnetic field to guide the free ions onto the target thereby generating free particles of target material which are deposited onto a substrate;

providing a disposable surface within said chamber below the target, applying R.F. power between the anode and the target forming the cathode to erode the target near the poles of the magnetic field;

moving the disposable surface from below the target; and re-applying D.C. power between said anode and said target forming said cathode.

13. The process of claim 12 wherein the steps of providing a disposable surface within the chamber and applying R.F. power occur while a first substrate is removed from the chamber and a second substrate is introduced into the chamber.

14. A process for cleaning a target in a D.C. powered sputtering source, comprising employing a magnetic source having at least two poles periodically partitioning off a deposition chamber to isolate the target with a shutter means; and applying R.F. power between an anode and said target biased as a cathode to remove any back sputtered material which may have been deposited between the poles of a magnetic field provided to guide free ions onto the target.

15. A method of cleaning a target in a D.C. powered sputtering source including a magnetron assembly, comprising:

periodically isolating said target in said sputtering source; and providing R.F. power between an anode and a target forming a cathode.

16. A magnetron sputtering apparatus comprising:

a) an evacuable chamber having a means of introducing gases, anodic sidewalls and base, and a pedestal support for holding a semiconductor substrate for processing;

b) a planar cathodic target within the chamber, a front face of the target being in parallel to the pedestal support;

c) partitioning means disposed between the target and pedestal to isolate the pedestal from communication with the chamber;

d) magnetic source means for generating a magnetic field over the surface of the target;

e) an alternative D.C. or R.F. voltage source means to generate an electric field over the front surface of the target; and f) switching means to alternate a D.C. or R.F. voltage supply to the planar cathodic target and the anodic sidewalls and base in the chamber.

17. A sputtering apparatus, comprising:

an anode;

a target arranged opposite to said anode which is biased as a cathode;

means for generating a magnetic field adjacent said target;

partitioning means disposed in proximity to said target, said partitioning means isolating a portion of the sputtering apparatus including the target; and switching means to alternate power supply between D.C. and R.F. power to said anode and said cathode.

18. A method of cleaning a target in situ, comprising:

providing a deposition chamber wherein deposition of a target material onto a substrate occurs under a first power source;

isolating the target from a substrate support member located in said chamber;

providing a second power source to sputter the target material onto a shutter means during an interim period required to remove one substrate from the chamber and introduce a second substrate into the chamber.

19. The method of claim 18, wherein said first power source supplies a D.C. voltage and said second power source supplies power in the radio frequency range.

20. The method of claim 18, wherein said first power source supplies power in the radio frequency range, and said second power source supplies a D.C. voltage.

* * * * *